(12) United States Patent
Collier et al.

(10) Patent No.: US 7,091,756 B2
(45) Date of Patent: Aug. 15, 2006

(54) INTEGRATED CIRCUIT

(75) Inventors: James Digby Collier, Cambridge (GB); Ian Michael Sabberton, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 09/541,857

(22) Filed: Apr. 3, 2000

(65) Prior Publication Data

US 2003/0006812 A1    Jan. 9, 2003

(51) Int. Cl.
*H03K 23/00* (2006.01)
*H03K 25/00* (2006.01)
(52) U.S. Cl. .................. 327/115; 327/117; 327/118
(58) Field of Classification Search ............ 327/114, 327/115, 117, 118, 200, 201, 203, 202, 205, 327/208–212, 218; 377/47, 48
See application file for complete search history.

(56) References Cited

U.S. PATENT DOCUMENTS

| | | | |
|---|---|---|---|
| 4,193,539 A | | 3/1980 | Bowman et al. .............. 377/46 |
| 4,356,411 A | * | 10/1982 | Suzuki et al. ............... 327/218 |
| 4,845,727 A | * | 7/1989 | Murray ......................... 377/47 |
| 5,020,082 A | * | 5/1991 | Takeda ......................... 377/44 |
| 5,036,217 A | * | 7/1991 | Rollins et al. .............. 327/200 |
| 5,049,760 A | * | 9/1991 | Ooms ........................... 327/212 |
| 5,117,127 A | | 5/1992 | Gobbi et al. .................. 326/34 |
| 5,172,400 A | * | 12/1992 | Maemura ...................... 377/47 |
| 5,189,685 A | * | 2/1993 | Jaffard et al. ................. 377/48 |
| 5,341,031 A | * | 8/1994 | Kinoshita et al. ........... 327/115 |
| 5,465,060 A | * | 11/1995 | Pelella ........................ 327/51 |
| 5,821,791 A | * | 10/1998 | Gaibotti et al. ............. 327/202 |
| 6,507,228 B1 | * | 1/2003 | Boerstler et al. ........... 327/199 |

FOREIGN PATENT DOCUMENTS

| | | |
|---|---|---|
| EP | 0424222 A1 | 4/1991 |
| EP | 0 488 826 A2 | 6/1992 |
| EP | 0 793 342 A2 | 9/1997 |
| JP | 57103434 | 6/1982 |
| JP | 60-224319 | * 11/1985 |
| JP | 61294932 | 12/1986 |
| JP | 3121620 | 5/1991 |
| JP | 04245713 | 9/1992 |
| JP | 05347554 | 12/1993 |

OTHER PUBLICATIONS

Electronic Circuits by Schilling et al., 1989, pp. 138-151.*
Weste and Eshraghian, Principles of CMOS VLSI Design, second edition, Fig. 5.55b, pp. 328, 1993.*
Foroudi, N., et al., "CMOS High-Speed Dual-Modulus Frequency Divider for RF Frequency Synthesis", *IEEE Journal of Solid-State Circuits*, vol. 30, No. 2, 93-100, (1995).

* cited by examiner

Primary Examiner—Tuan T. Lam
(74) Attorney, Agent, or Firm—Schwegman, Lundberg, Woessner and Kluth P.A.

(57) ABSTRACT

A frequency divider circuit is provided having an even number of amplifier stages connected in series with the output of the last amplifier stage connected to the input of the first amplifier stage; and modulating means responsive to an input signal to be frequency divided, for modulating the propagation delay through each of the amplifier stages about the period of the input signal to be divided, such that when propagation through the odd amplifier stages increases, the propagation through the even amplifier stages decreases. The frequency divider circuit can be used as a pre-scaler of a radio receiver circuit.

30 Claims, 8 Drawing Sheets

INTEGRATED CIRCUIT

The present invention relates to a semiconductor integrated circuit and more particularly to a CMOS or similar type of circuit when used in a frequency divider circuit ("pre-scaler").

In many high frequency radio receivers a synthesiser and a voltage controlled oscillator are required to generate the local carrier signal that is used to perform a first demodulation of the received high frequency radio signal. However, the synthesiser is generally unable to take the high frequency carrier signal directly as an input. Therefore a pre-scaler must be used to divide the carrier frequency down to a frequency that can be accepted by the synthesiser. A pre-scaler circuit generally comprises a number of divide by 2 circuits and some control logic to provide, for example, a divide by 16 or 17 circuit. Each divide by 2 circuit generally comprises a pair of latch circuits connected in a master slave configuration.

In a conventional CMOS latch circuit capable of lower frequency operation, a signal on the data input is passed through to the output while the clock signal is high. When the clock signal goes low the latch maintains the same output until the clock signal goes high again, when a new data value is allowed through. The conventional CMOS latch comprises two inverters connected in series and two transmission gates. The data input of the latch is connected to the input of the first inverter through one of the transmission gates. The output of the second inverter (which is also the output of the latch) is fed back to the input of the first inverter through the other transmission gate. To prevent the feedback and the data input interfering with each other, the two transmission gates are driven by antiphase clock signals such that when one is open the other is closed.

The maximum frequency at which the latch can be clocked depends on the speed at which the transmission gates can open and close, and of course the propagation delay through the inverters. The CMOS transmission gates require to be driven with clock signals having substantially the full swing of the power supply voltage between states. The maximum operating frequency of a CMOS latch is therefore in practice much lower than that of a latch constructed in a suitable high frequency bipolar technology such as ECL. Furthermore, CMOS circuits consume a lot of power at high frequencies, therefore, when high speed pre-scalers are required bipolar technology is invariably used, whereas for low speed digital devices CMOS or other MOS technology is often preferred. In applications where both high speed and low speed digital functions are required, it is therefore commonly necessary to employ two separate chips, one using CMOS technology for performing the low speed digital functions and the other using bipolar technology for performing high speed digital and analogue functions. The need for two separate chips increases the cost and size of the final product. Alternatively, a more complex and expensive IC process which supports both bipolar and CMOS transistors could be used.

According to one aspect, the present invention provides a frequency divider circuit comprising a number of amplifier stages connected in series with the output of a terminating amplifier stage connected to the input of a preliminary amplifier stage and modulating means responsive to an input signal to be frequency divided, for modulating the propagation delay through each of the amplifier stages such that when the propagation delay through one set of amplifier stages increases, the propagation delay through the other amplifier stages decreases.

The present invention also provides a semiconductor latch comprising: a data input, a data output, a clock input, two inverters connected in a memory arrangement with the output of one connected to the input of the other and input means connected to the memory arrangement for writing new data applied to the data input into said memory arrangement, independence upon a clock signal applied to said clock input, characterised in that the latch comprises varying means for varying the time taken for new data to be written into said memory arrangement.

The present invention also provides a method of frequency division using a number of amplifier stages connected in series with the output of the last amplifier stage connected to the input of the first amplifier stage, the method comprising: modulating the propagation delay through each of the amplifier stages such that when the propagation delay through a given group of amplifiers stages increases, the propagation through another group of amplifier stages decreases.

The frequency divider or latch circuit embodying the present invention can be used in many applications. For example, it can be used to generate a local carrier in a radio receiver circuit.

Embodiments of the invention will now be described, by way of example only, with reference to the accompanying drawings in which:

FIG. 1b shows a logic equivalent circuit of the latch circuit shown in FIG. 1a;

Figure 1A:
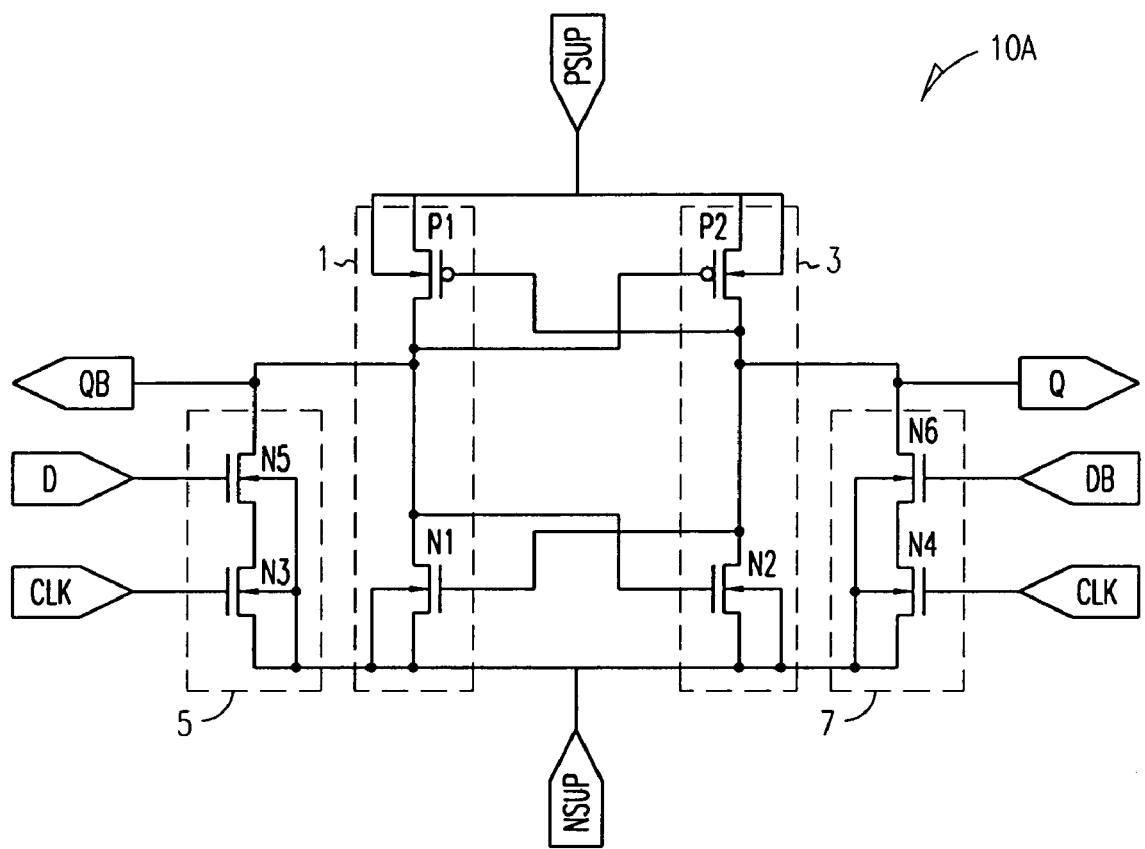
FIG. 1a shows a latch circuit according to a first embodiment of the present invention.
Figure 4:
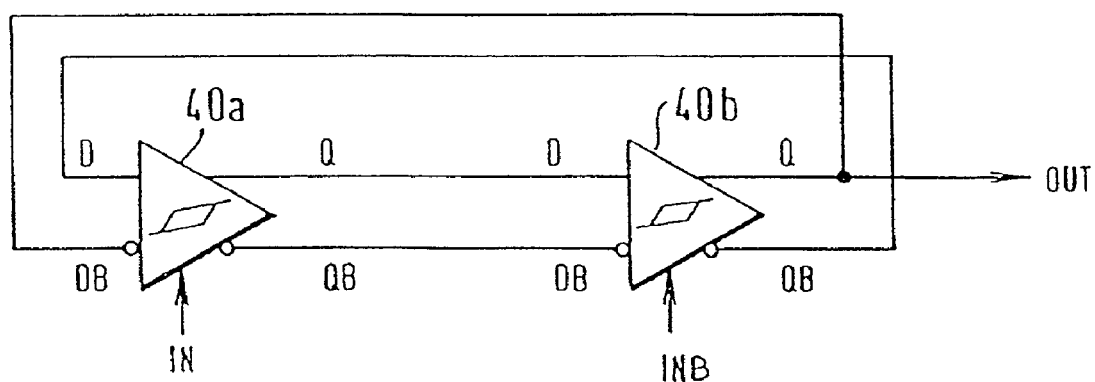
FIG. 4 shows a frequency divider circuit according to a second embodiment of the present invention.
Figure 5:
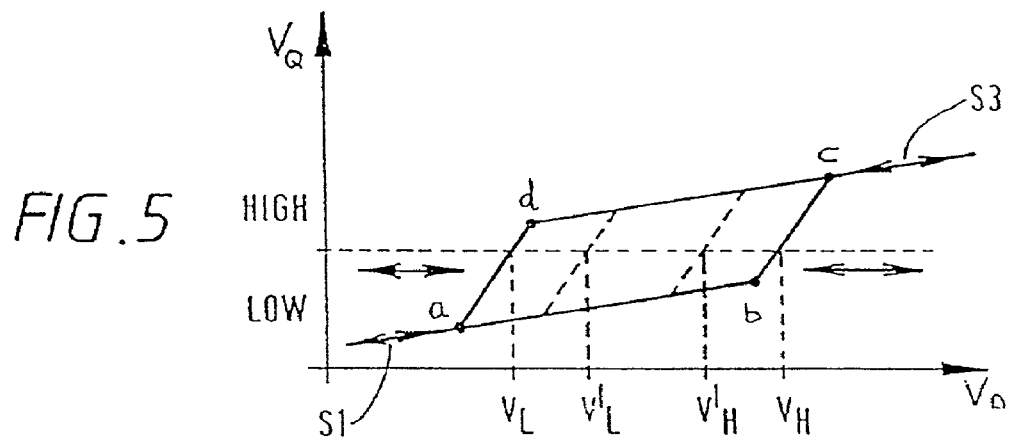
Figure 7B:
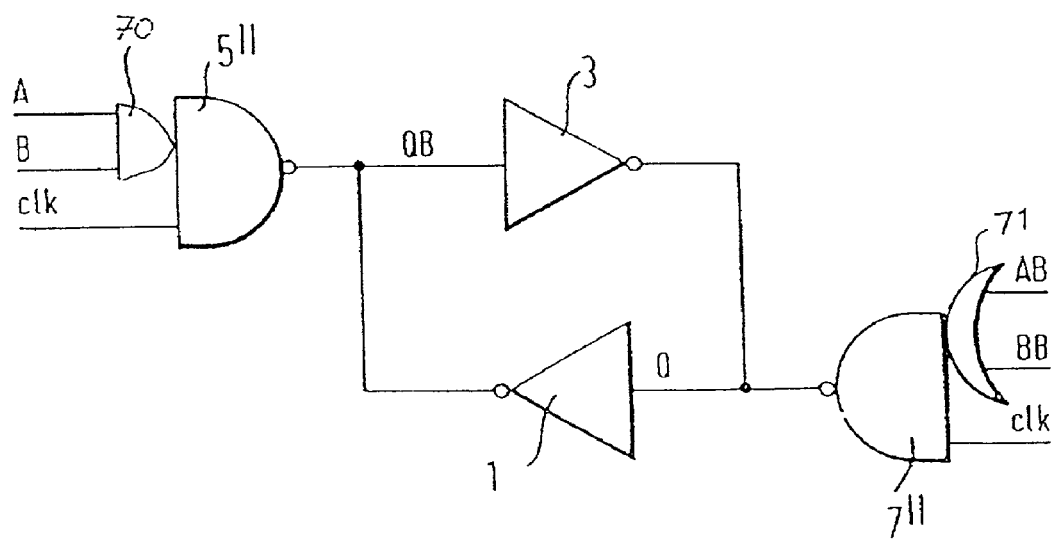
Figure 6:
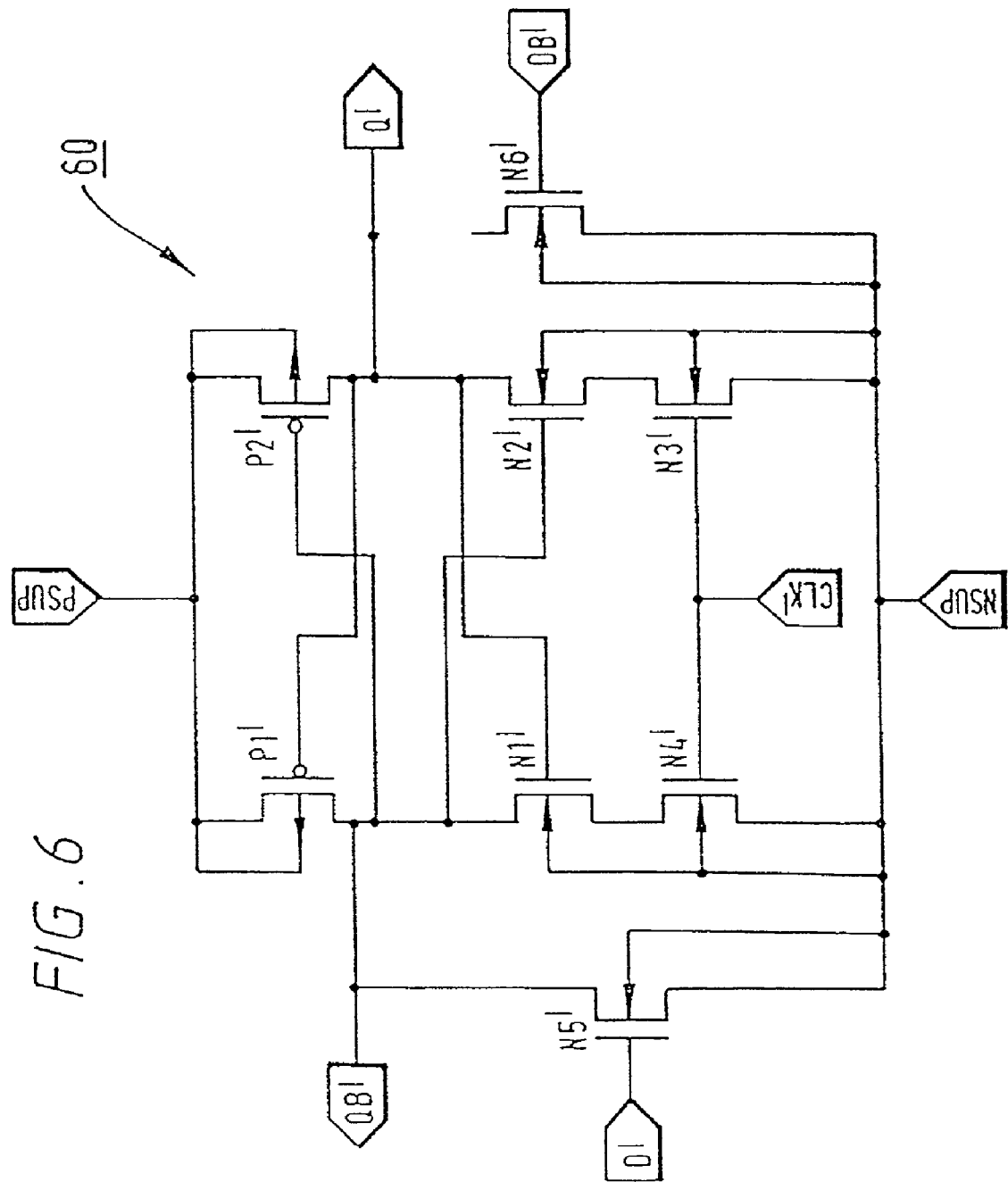
Figure 7A:
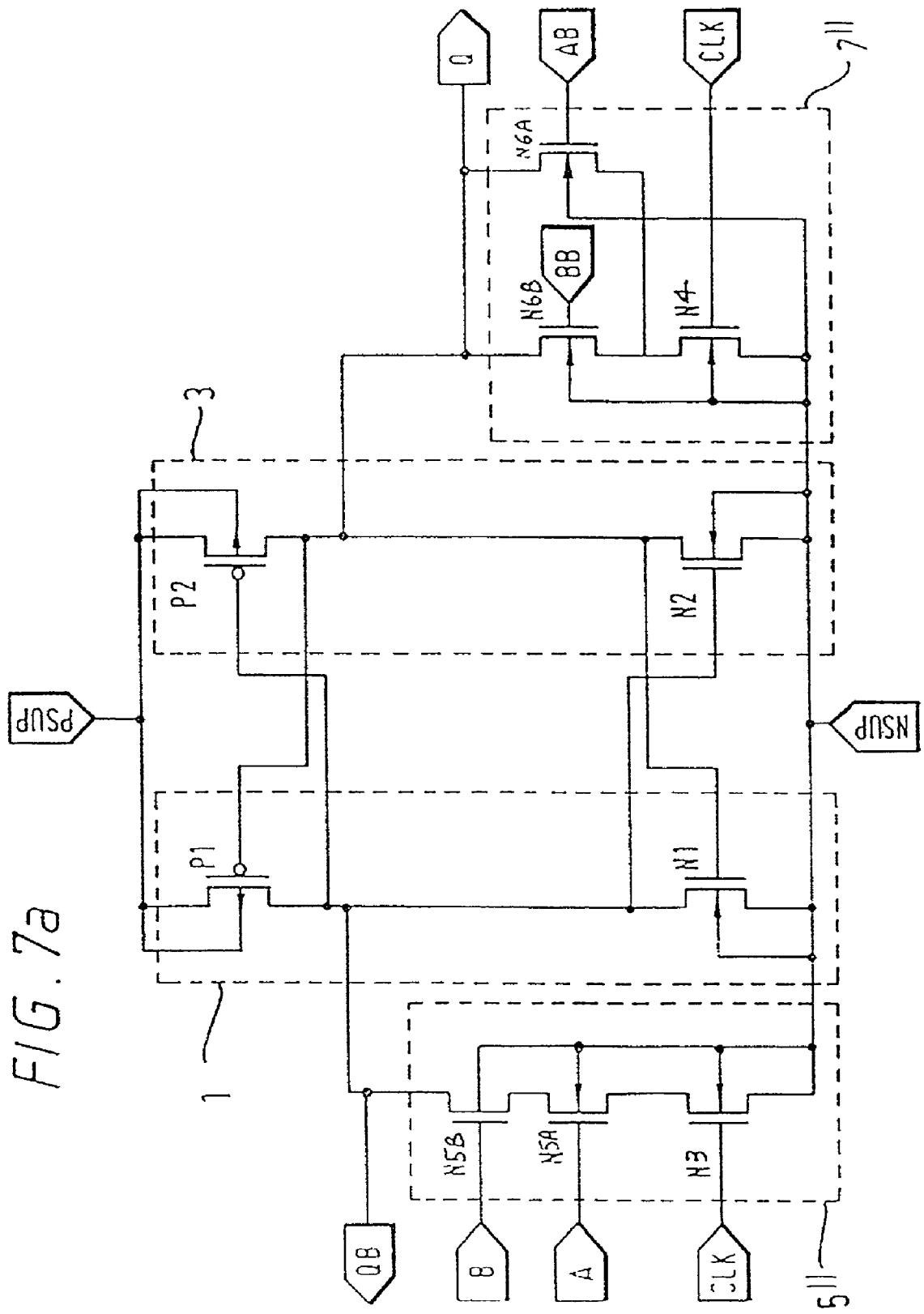
Figure 8:
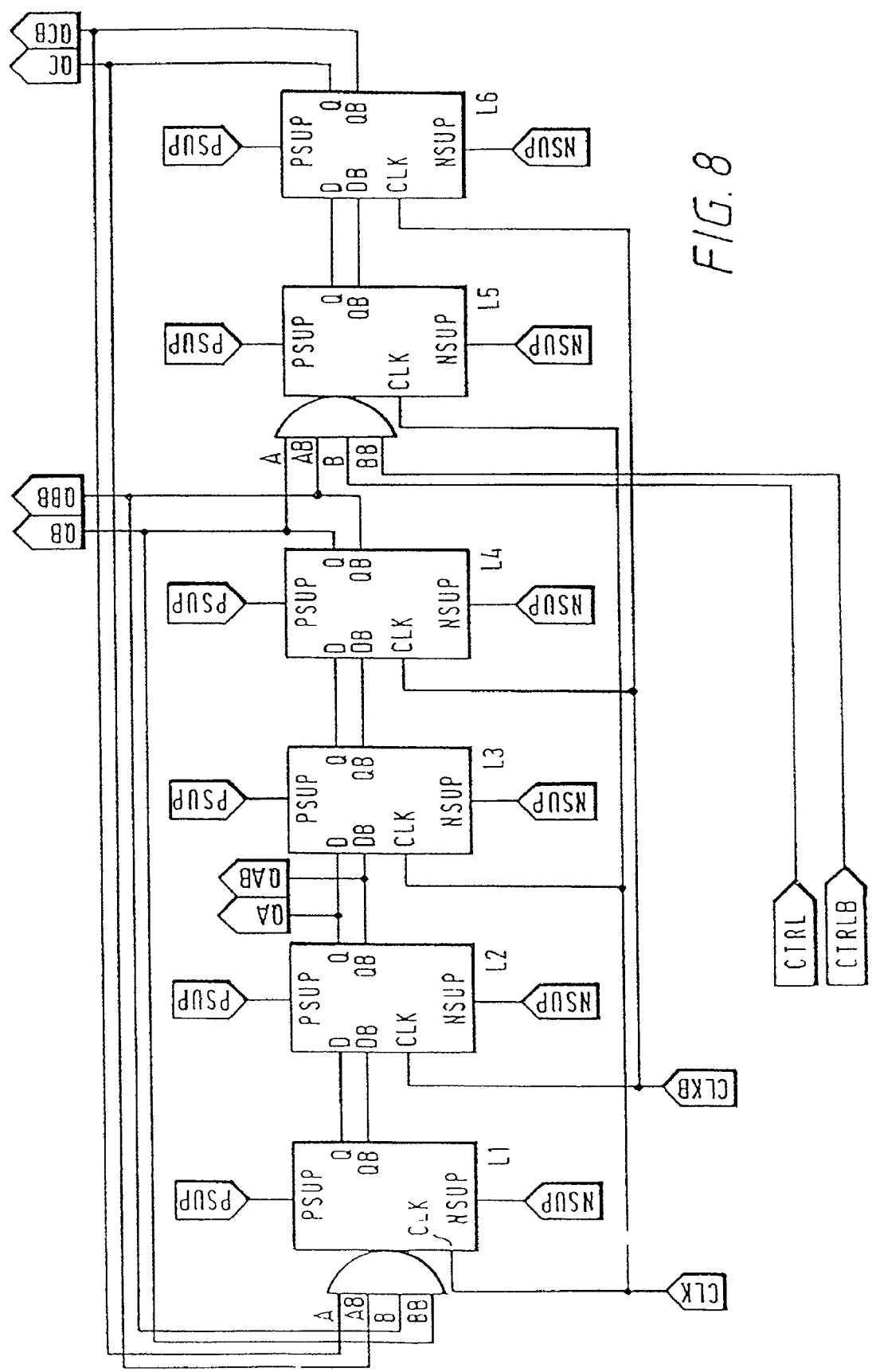
Figure 9:
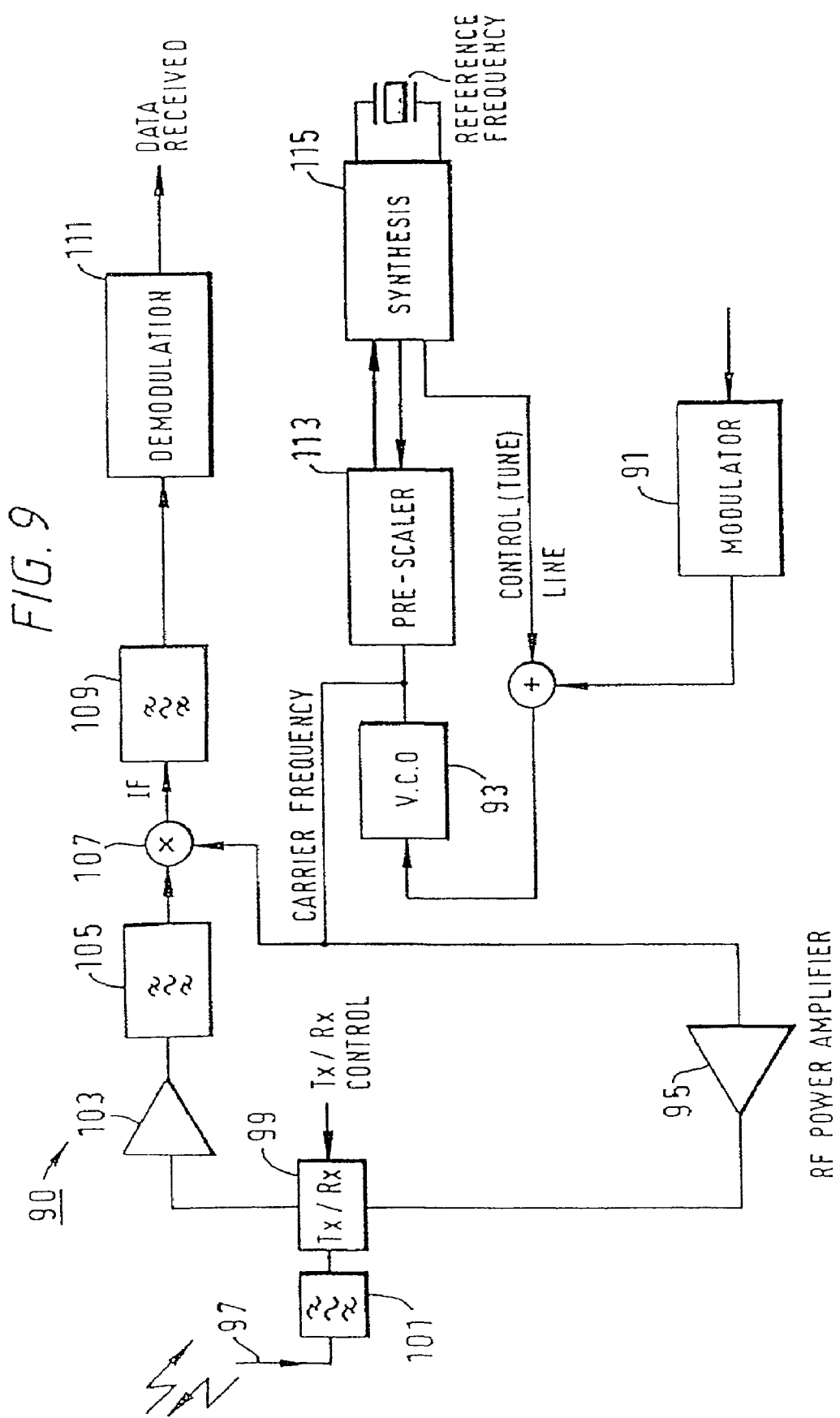

FIG. 5 schematically shows the input/output relationship of the differential amplifiers with hysteresis used in the second embodiment;

FIG. 6 shows a second embodiment of a latch circuit that may be employed in the frequency divider circuit shown in FIG. 4;

FIG. 7a is a circuit diagram that demonstrates how the latch circuit shown in FIG. 1a can be modified to provide additional logic functions;

FIG. 7b shows a logic equivalent circuit of the latch circuit shown in FIG. 7a;

FIG. 8 is a circuit diagram showing a divide by four/five circuit using latch circuits according to embodiments of the present invention;

FIG. 9 shows a simplex frequency modulated radio transmitter and receiver for digital data of relatively low bit rate, according to an embodiment of the present invention.

Figure 1B:
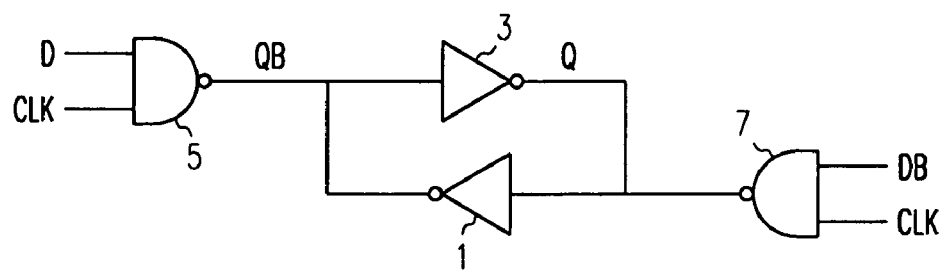
Figure 1C:
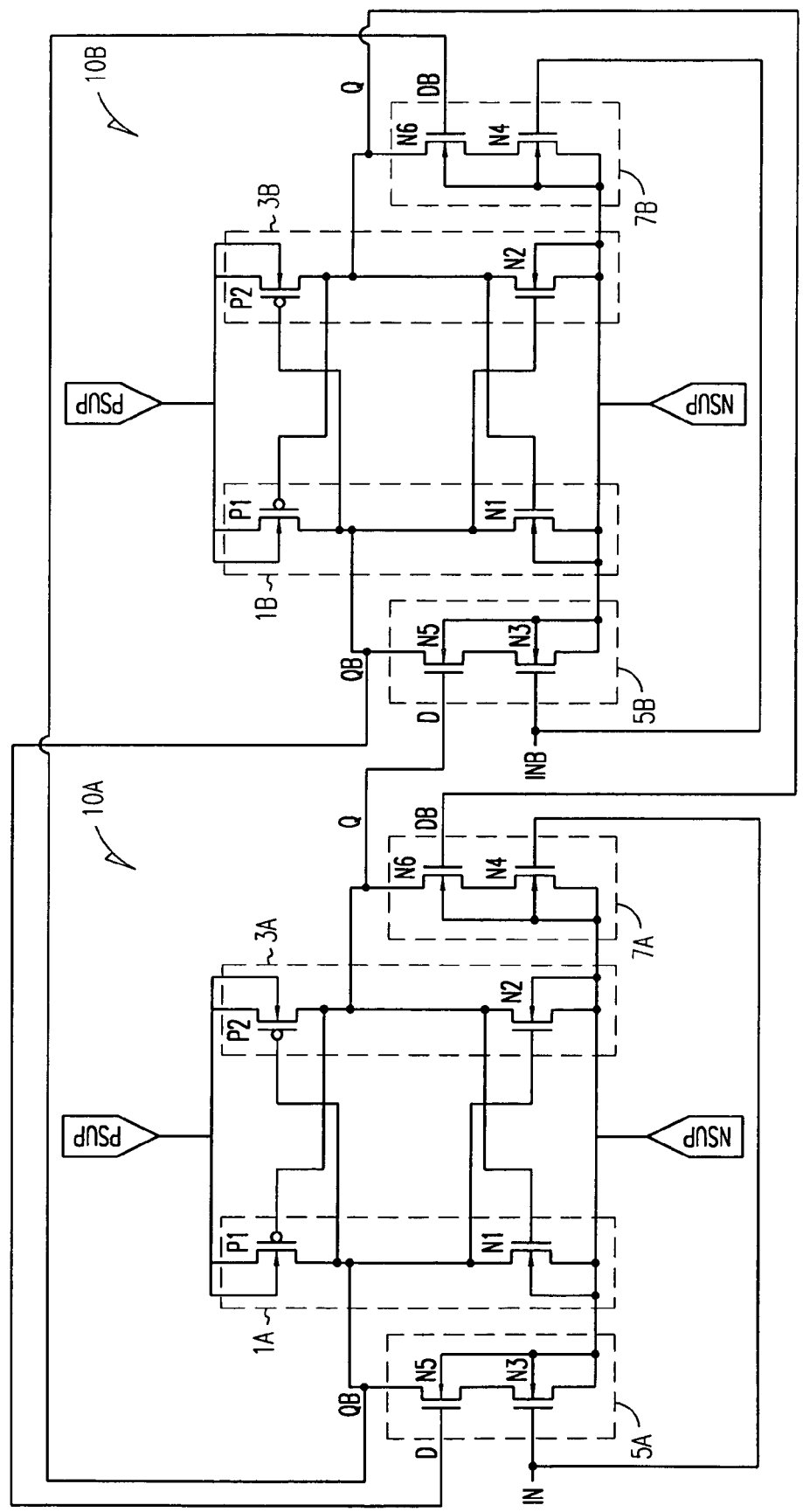
FIG. 1c shows two of latches shown in FIG. 1a connected in cascaded to form a frequency divider.

FIG. 1a shows a latch circuit generally indicated by reference numeral 10, according to an embodiment of the present invention and FIG. 1b shows a logic equivalent circuit thereof. The latch has clock inputs CLK, a data input D, a complementary data input DB, a data output Q and a complementary data output QB. In the present description and drawings, the suffix "B" is used throughout to indicate the complement of a given logic signal such that when Q=0, QB=1 and vice versa.

In the circuit of FIG. 1a, p-channel MOS transistor P1 and n-channel MOS transistor N1 form a first CMOS inverter 1 with input Q and output QB and p-channel transistor P2 and n-channel transistor N2 form a second inverter 3 with input QB and output Q. The two inverters 1 and 3 are connected in an arrangement similar to a standard static memory cell, with the output of one connected to the input of the other, as shown in FIG. 1b. This is in contrast to the more typical CMOS latch using transmission gates, described above. The circuit also comprises two pairs of n-channel transistors connected in series (N3 and N5; N4 and N6) each of which performs a NAND type function having inputs D and CLK, and DB and CLK respectively, and outputs QB and Q respectively. These two NAND type circuits are represented by NAND gates 5 and 7 in the logic equivalent circuit shown in FIG. 1b, and will be referred to hereinafter as NAND gates 5 and 7. However, as those skilled in the art will appreciate, these circuits do not form complete CMOS NAND gates.

In operation, provided CLK remains low, the positive feedback connection between inverters 1 and 3 maintains the latch in whatever is its present state (Q low/QB high) or Q high/QB low). When CLK goes high, however, the state of the latch can be changed, depending on the data inputs D/DB. For example, if a logic high is on QB and a logic high is applied to CLK while D is high, then QB is forced to a logic low. Similarly, if a logic high is on Q and a logic high is applied to CLK while DB is high, then Q is forced to a logic low. When CLK goes low again, the new state is preserved.

The n-channel transistors N1 and N2 of the two inverters 1 and 3 are made "weaker" than the transistors in the corresponding NAND gate 7 and 5 that drives them, so that the logic level within the memory cell arrangement can be overwritten. This is achieved in the present embodiment by reducing the width to length ratio (aspect ratio) of the transistors N1 and N2 compared to the aspect ratio of transistors N3, N5 and N4, N6. Table 1 below lists suitable dimensions for each of the transistors shown in FIG. 1A, in 0.7 μm and 0.5 μm processes as alternatives. The transistors N3, N4 responsive to the clock signal CLK are made particularly "strong".

TABLE 1

| Transistor | Width:Length (0.7 μm Process) | Width:Length (0.5 μm Process) |
|---|---|---|
| P1 | 6:1 | 8:0.5 |
| P2 | 6:1 | 8:0.5 |
| N1 | 2.2:0.7 | 2.2:0.5 |
| N2 | 2.2:0.7 | 2.2:0.5 |
| N3 | 32:0.7 | 32:0.5 |
| N4 | 32:0.7 | 32:0.5 |
| N5 | 6:0.7 | 8:0.5 |
| N6 | 6:0.7 | 8:0.5 |

The propagation delay through the latch 10 is dependent upon the time taken to force either Q or QB into a logic low after D/DB changes. If an analogue signal is applied to CLK instead of a logic signal, transistors N3 and N4 are not necessarily fully open or fully closed, but act as variable resistances, the values of which fluctuate in response to the clock signal (CLK). As a result of this fluctuating resistance, the time taken to force the latch 10 into each different state is modulated and so the propagation delay through the latch 10 is modulated.

The inventors have found that by utilising the delay modulation effect of this type of latch, a pre-scaler circuit can be made which is capable of operating at much higher frequencies than those currently available in current CMOS technology. In particular, by applying an oscillating signal to the CLK input, the propagation delay can be modulated successfully even at a frequency which is far too high for normal "digital" operation of the latch.

Figure 2:
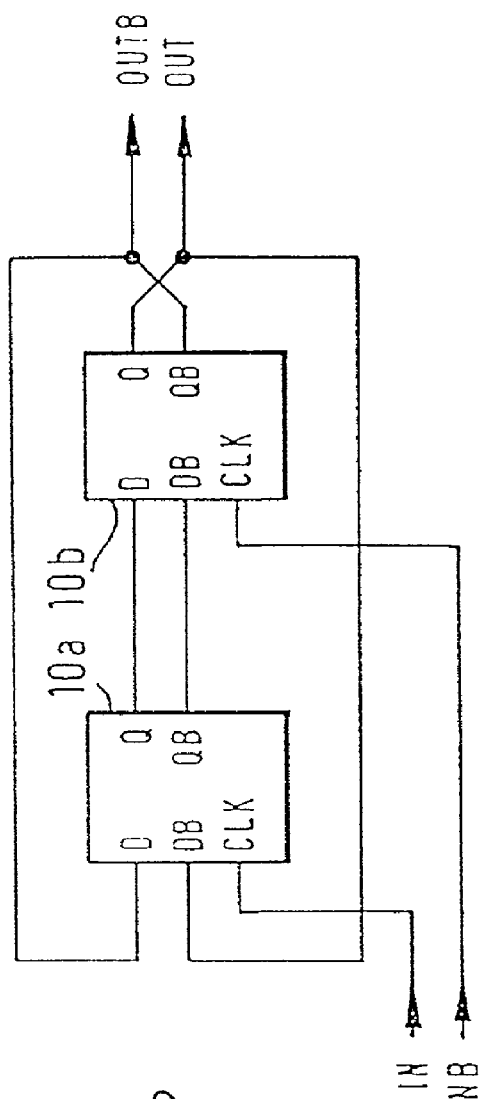
FIG. 2 shows two of the latches shown in FIG. 1a cascaded together and connected to form a divide by 2 frequency divider.

FIG. 2 shows two such latch circuits 10a and 10b connected together to form a divide by 2 frequency divider. The Q and QB outputs of the first latch 10a are connected to the D and DB inputs respectively of the second latch 10b, and the Q and QB outputs of the second latch 10b are connected to the DB and D inputs respectively of the first latch 10a. The input signal (IN) whose frequency is to be divided is applied to the clock input CLK of the first latch 10a, and an antiphase version (INB) of the input signal to be divided is applied to the clock input CLK of the second latch 10b. The signals IN and INB oscillate with a certain amplitude about a voltage midway between logic high and low levels.

Connected in this manner, the circuit acts as a ring oscillator and a chain of logic high and logic lows propagate round. The rate at which the logic high and logic lows propagate depends upon the propagation delay through each latch 10a and 10b. If the delay through latch 10a is $T_1$ and the delay through latch 10b is $T_2$ then the oscillation frequency=$1/[2(T_1+T_2)]$.

If the delays $T_1$ and $T_2$ are made to vary cyclically, with frequency $f_{in}$, about a value of $1/[2f_{in}]<T_1$ and $T_2<1/[2f_{in}]$) such that $T_1$ increases when $T_2$ decreases and vice versa, then the logic highs and lows can only propagate round the circuit with a delay of $2/f_{in}$. Any signal that tries to propagate round the circuit any faster or slower than this will automatically be slowed down or speeded up, as the case may be, due to the alternating delay values. In this way, the circuit becomes an oscillator locked at frequency $f_{in}/2$, and thereby forms a frequency divider, since $f_{in}$ is the frequency of the input signal IN/INB. When viewed in this way, the operation of the circuit can be likened to a so-called parametric amplifier.

The inventors have established that by performing the frequency division operation in this manner, a CMOS pre-scaler circuit can operate at frequencies ($f_{in}$) up to about 600 MHz, using only a conventional 0.7 μm CMOS process. The ability to operate at these frequencies permits the integration of more functions on a single chip.

To explain how the frequency divider shown in FIG. 2 operates at a different level, it is useful to consider each latch 10a and 10b as being a differential amplifier with hysteresis having a modulation input that can be used to vary the propagation delay through the amplifier. In this embodiment, the modulation input amplitude modulates the inputs applied to the amplifiers, while the hysteresis remains constant.

Figure 3:
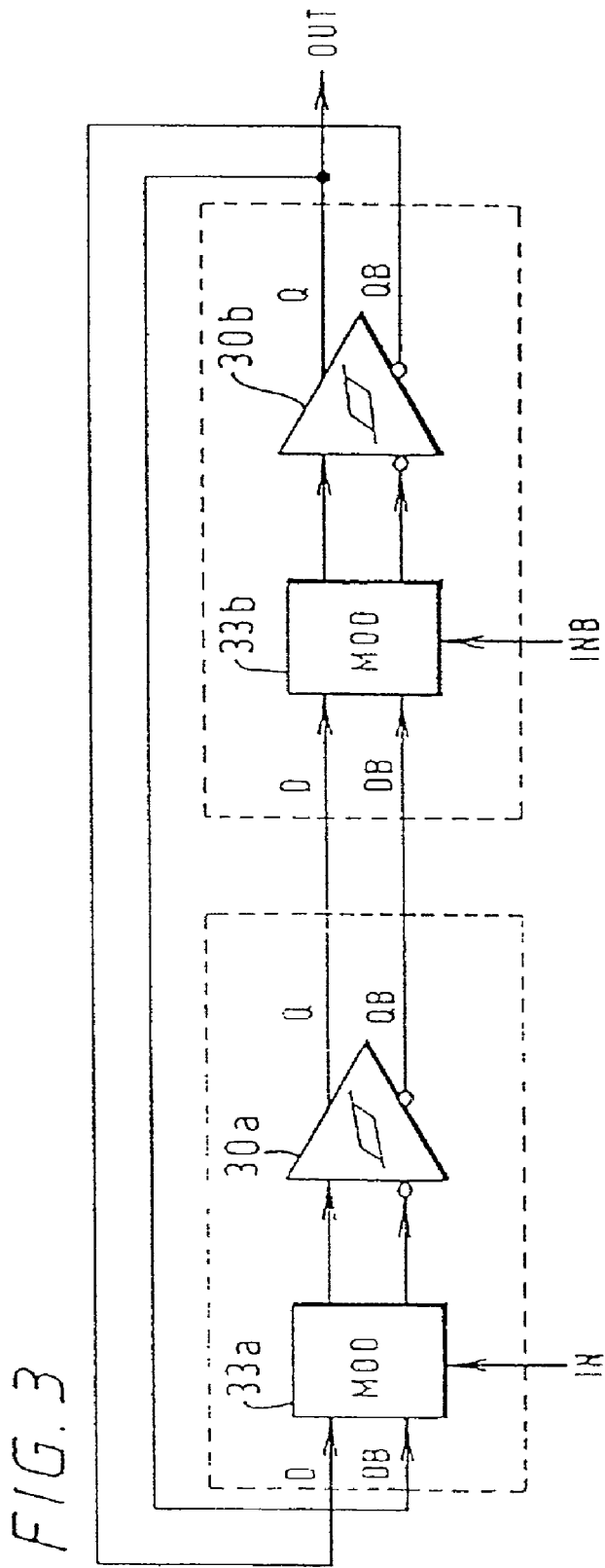
FIG. 3 is a generalised equivalent circuit of the frequency divider shown in FIG. 2, with each latch being represented by a differential amplifier with hysteresis and a modulation block.

FIG. 3 is an equivalent circuit diagram of the frequency divider shown in FIG. 2 with each latch 10a and 10b being represented by a differential amplifier with hysteresis 30a and 30b and a modulation block 33a and 33b as described above. Modulation block 33a is driven by the input signal (IN) to be divided and modulation block 33b is driven by the inverse (INB) of the input signal to be divided.

As mentioned above, the modulation blocks 33a and 33b act as means for varying the propagation delay of each amplifier, which is achieved in this embodiment by varying the resistance of clock transistors N3/N4 in series with input transistors N5/N6, effectively varying the strength of connection from one amplifier to the other. If the strength of the connection is reduced between amplifier 30a and amplifier 30b then it will take longer for the signal to propagate through the amplifier 30b. On the other hand, if the strength of connection is increased between amplifier 30a and amplifier 30b then it will take less time for the signal to propagate through the amplifier 30b. Similarly, the propagation delay through amplifier 30a can be varied by changing the strength of connection between amplifier 30b and amplifier 30a. In this way, delay $T_1$ and $T_2$ can be changed by varying the strength of the connection between the two amplifiers.

After generalising the circuit shown in FIG. 2 to the equivalent circuit shown in FIG. 3, it will be seen that the same modulation effect can be achieved in other ways, for example by modulating the hysteresis of the amplifiers directly as illustrated in FIGS. 4 and 5.

FIG. 4 schematically shows the differential amplifiers with hysteresis connected in series and having output Q of the second amplifier 40b connected to the DB input of the first amplifier 40a, and output QB connected to the D input of the first amplifier. The input signal IN is applied to the first amplifier 40a for varying the hysteresis thereof and complementary input signal INB is applied to the second amplifier 40b for varying the hysteresis thereof.

FIG. 5 schematically shows the input/output characteristic of each amplifier 40a and 40b shown in FIG. 4 including hysteresis. The overall negative feedback (due to the coupling from the Q output of the second stage to the DB input of the first) overcomes the positive feedback necessary to create hysteresis of each latch. The effect of this is such that by changing the hysteresis the effective propagation delays ($T_1$ and $T_2$) through the amplifiers change, while the strength of the connections between the amplifiers remains constant. In particular, if delays $T_1$ and $T_2$ are made to vary cyclically, with frequency $f_{in}$ about a value of $1/[2f_{in}]$, (i.e. $1/[2f_{in}]<T_1$ and $T_2>1/[2f_{in}]$) such that when $T_1$ increases $T_2$ decreases and vice versa then, as in the first embodiment, the logic high and lows can only propagate around a circuit with frequency $f_{in}/2$.

FIG. 6 shows a latch circuit generally indicated by reference numeral 60 which may be used to form the amplifier shown in FIG. 4, namely a latch circuit whose hysteresis can be varied. The latch 60 is similar to latch 10 shown in FIG. 1a, but with the transistors N3', N4' placed in series with transistors N2' and N1' respectively, rather than in series with transistors N5' and N6' respectively.

As in the first embodiment, the propagation delay through the latch 60 is dependent upon the time taken to force either Q' or QB' into a logic low. Further, when a high frequency signal is applied to CLK, transistors N3' and N4' do not necessarily have time to become fully open or fully closed, but anyhow act as variable resistances, the values of which fluctuate in response to the input signal (CLK). As a result of this fluctuating resistance, the time taken to force the latch 60 into each different state is modulated and so the propagation delay through the latch 60 is modulated. Therefore, in this embodiment the clock signal is effectively modulating the propagation delay by modulating the hysteresis of the latch circuits.

FIG. 7a shows how the latch circuit shown in FIG. 1a can be modified to include other logic functions (similar modifications could be made to the latch circuit shown in FIG. 6). The same reference signs are used in FIG. 1a so far as possible. In particular, FIG. 7a comprises a P-channel MOS transistor P1 and N-channel MOS transistor N1 which form a first CMOS inverter 1 with input Q and output QB, and P-channel transistor P2 and N-channel transistor N2 which form a second inverter 3 with input QB and output Q. As in the latch circuit shown in FIG. 1a, the two inverters 1 and 3 are connected in a standard static memory cell arrangement with the output of one connected to the input of the other, as shown in FIG. 7b. The latch circuit also comprises transistors N3, N6A and N6B which together form a circuit that performs a three input NAND type function having inputs A B and CLK and output QB, and is represented by NAND gates 70 and 5 in FIG. 7b. The circuit also comprises transistors N6A and N6B in parallel and transistor N4 connected in series with the parallel combination of transistors N6A and N6B. The parallel combination of transistors N6A and N6B forms a circuit that performs an OR type function and is represented by OR gate 71 in FIG. 7b. The transistor N4 and the above parallel combination together form a circuit that performs a NAND type function, and is represented by NAND gate 7 in FIG. 7b.

The circuit shown in FIG. 7a operates as follows. When QB is high and inputs A, B and CLK are all high, then QB will be forced to a logic low. Similarly, when Q is high and either (i) input AB (complement of A) and CLK are high or (ii) input (complement of B) BB and CLK are high, then Q will be forced to a logic low. In other words, the output of the latch (Q) will be low unless both inputs A and B are high when CLK is high. Therefore, the latch circuit shown in FIG. 7a effectively comprises a D-type latch whose Data input is a logical AND function of inputs A and B.

As those skilled in the art will appreciate, the addition of the extra logic circuitry will not affect the principle of operation of the latch circuit when employed in a frequency divider circuit. Therefore, the latch circuit can be employed in more complex counter circuits and still maintain the speed advantage over the known devices.

FIG. 8 shows an example of a pre-scaler circuit that can perform a divide by four or divide by five operation. The circuit as shown comprises four latch circuits of the type shown in FIG. 1a or FIG. 6 (L2, L3, L4 and L6) and two latch circuits of the AND gate type shown in FIG. 7a (L1 and L5). A control input CTRL/CTRLB is connected to the B/BB input of latch L5. The circuit will divide by four when the CTRL is low and will divide by five when the CTRL is high and can operate at frequencies up to about 450 MHz from 3V supplies and up to 600 MHz at 5V, on a 0.7 µm process. The principle of operation of the circuit is the same as that of the divide by two circuit shown in FIG. 2, and will not be described again.

All of the latches L1 to L5 are clocked by the input signal IN/INB whose frequency is to be divided. Alternatively, the counter circuit could comprise a plurality of divide by two circuits, like those shown in FIG. 2, connected in series with the output of one divide by 2 circuit being applied to the clock input of the next adjacent divide by two circuit. This has the advantage that later stages can be dimensioned for lower speed and lower current operation, but is limited to powers of two in the choice of division factors. By providing division factors of four and five ($2^2$ and $2^2+1$) with suitable control logic, any integer division factor greater than 4×5 can be achieved.

FIG. 9 shows an application for the novel frequency divider circuits in the form of a simplex frequency modulated (FM) radio transmitter and receiver generally indicated by reference numeral 90, for digital data of relatively low bit rate. Applications of such a radio include mobile pagers, and also in future data transmission for control and metering of utilities such as gas and electricity supplies. The general structure of the transmitter/receiver is of a form well-known to those skilled in the art and will not be described in depth.

Referring to FIG. 9, when data is to be transmitted it is first modulated in modulation block 91 using a data modulating technique such as quadrature phase shift keying (QPSK) and then supplied to the input of a voltage controlled oscillator (VCO) 93. The output of the VCO 93 is a radio frequency (RF) signal modulated by the QPSK signal which is then amplified by a power amplifier 95 and broadcast from an antenna 97 via a transmit/receive control switch 99 and filter 101.

When data is to be received, RF input signals picked up by the antenna 97 are filtered in filter 101 to remove noise and passed to an RF amplifier 103 via the transmit/receive control switch 99. The amplified signals are then filtered again in a filter 105 to remove unwanted carrier signals that might result in "image signals" at an IF stage. A mixer 107 converts the RF input signals down to intermediate frequency (IF) signals by multiplying the incoming RF signals by a locally generated carrier signal. The IF signals at the output of the mixer 107 are then filtered again by a ceramic resonator or similar filter 109 which has a flat response over the required bandwidth and large attenuation either side of the passband. The received data is then retrieved by demodulating the IF signal output from the ceramic filter 109 in a demodulation block 111.

Although it is very effective as a filter, the centre frequency of the ceramic type filter 109 has a fixed value. It is not possible to vary this centre frequency in order to re-tune the radio to other carrier frequencies, and at the same time maintain the required attenuation on either side of the passband. The solution to this problem is to ensure that the IF signals at the output of the mixer 107 are always centred at the same frequency. Therefore, to receive other modulated carriers, the local carrier signal applied to the mixer 107 must be variable to convert the desired RF signals down to the fixed IF frequency.

This is conventionally achieved by using a voltage controlled oscillator (VCO) 93, a pre-scaler 113 and a digital frequency synthesiser 115 connected in the manner shown in FIG. 9. The frequency of the output signal from the VCO 93 is controlled by the input voltage thereto supplied by the synthesiser 115, while the synthesiser receives a version of the VCO output signal, frequency divided by the pre-scaler 113.

Frequency division is conventionally thought of as a digital function and the maximum frequency the pre-scaler 113 can reduce depends on the digital circuit technology used. With RF input signals, bipolar transistor technology is normally used which can operate at the high RF frequencies. However, when a low cost, low power CMOS chip is used for the synthesiser 115 (and perhaps also for the data decoding, processing and control operations of the receiver as a whole), this results in the need for a second chip for performing the frequency division, which increases the cost and size of the transmitter/receiver 90. In contrast, the pre-scaler 113 in the transmitter/receiver of FIG. 9 uses the novel frequency divider described above. By this feature, every part of the simplex transmitter/receiver 90, with the possible exception of the analog filters, can be built into a single MOS integrated chip, thereby reducing the overall cost and size of the data transmitter/receiver 90. The mixer 107 can be implemented by MOSFET transistors also integrated on the same chip.

The invention claimed is:

1. A signal generating circuit comprising:
   a first generating means for generating a first periodic signal;
   a second generating means for generating a second periodic signal which is in anti-phase with the first periodic signal;
   a frequency divider circuit comprising,
   (i) first and second input terminals for respectively receiving the first and second periodic signals;
   (ii) an even number of amplifier stages connected in series with an output of the last amplifier stage being connected to an input of the first amplifier stage, wherein each amplifier stage has an associated propagation delay and a transistor coupled between a supply terminal and a reference terminal for modulating the propagation delay through the associated amplifier stage;
   (iii) means for applying said first periodic signal received at said first input terminal to a control electrode of said transistor of the or each odd amplifier stage and for applying said second periodic signal received at said second input terminal to a control electrode of said transistor of the or each even amplifier stage, to modulate the propagation delays through the associated amplifier stages about half the period of said first and second periodic signals so that when the propagation delay through the or each even amplifier stage decreases, the propagation delay through the or each odd amplifier stage increases; and
   (iv) an output terminal connected to the output of said last amplifier stage for outputting a generated frequency divided signal;
   wherein said first and second generating means are arranged to generate the respective first and second periodic signals as analogue periodic signals having an amplitude which causes said transistors to be not fully open or fully closed but act as variable resistances, and
   wherein each of the transistors of each odd amplifier stage that is used to modulate the propagation delay through the odd amplifier stage references the first periodic signal to a voltage supply, and each of the transistors of each even amplifier stage that is used to modulate the propagation delay through the even amplifier stage references the second periodic signal to the same voltage supply.

2. A circuit according to claim 1, wherein there are two amplifier stages connected in series.

3. A circuit according to claim 1, comprising a plurality of said frequency divider circuits connected in series.

4. A circuit according to claim 1, wherein each amplifier stage comprises a differential amplifier.

5. A circuit according to claim 1, wherein each amplifier stage comprises connection logic circuitry which includes said transistor so that for each amplifier stage the respective one of the first and second analogue periodic signals is operable to vary the propagation delay though the connection logic circuitry.

6. A circuit according to claim 1, wherein each amplifier stage comprises an amplifier with hysteresis which includes said transistor so that for each amplifier stage the respective one of the first and second periodic signals is operable to vary the hysteresis of the respective amplifier.

7. A circuit according to claim 1, wherein said frequency divider circuit is a FET type semiconductor circuit.

8. A circuit according to claim 7, wherein said frequency divider circuit is integrated monolithically with complementary FET logic.

9. A circuit according to claim 7, wherein said frequency divider circuit is a CMOS circuit integrated monolithically with CMOS logic circuitry.

10. A circuit according to claim 7, wherein said transistor is a first transistor, and wherein the input to each amplifier stage is formed by the gate of a second transistor.

11. A circuit according to claim 10, wherein the first and second transistors are connected in series between the supply terminal and the reference terminal.

12. A circuit according to claim 1, wherein the first and second analogue periodic signals have a frequency greater than 100 MHz.

13. A circuit according to claim 1, wherein said frequency divider circuit further comprises logic means for providing dividing by ratios other than simple powers of two.

14. A circuit according to claim 1, wherein each of said amplifier stages comprises a latch circuit having two inverters connected in a memory arrangement with the output of one connected to the input of the other.

15. A circuit according to claim 14 in which each inverter comprises a p-channel transistor and a n-channel transistor, and wherein the latch circuit further comprises two pairs of n-channel transistors operable to control the state of said memory arrangement.

16. A circuit according to claim 15, wherein the aspect ratio of the n-channel transistor of each inverter is less than the aspect ratio of the n-channel transistors in the two pairs of n-channel transistors which control the state of said memory arrangement.

17. A signal generating circuit according to claim 1, wherein said first and second generating means are formed by a single circuit which is operable to generate said first and second periodic signals.

18. A method of frequency division using an even number of amplifier stages connected in series, with an output of the last amplifier stage connected to an input of the first amplifier stage and each amplifier stage having a transistor coupled between a supply terminal and a reference terminal, said method comprising the steps of:
applying a first periodic signal to be frequency divided by the frequency divider circuit to a control electrode of the respective transistor of the or each odd amplifier stage; and
applying a second periodic signal which is in anti-phase with the first periodic signal to a control electrode of the respective transistor of the or each even amplifier stage, thereby to modulate the propagation delays through the associated amplifier stages about half the period of said first and second periodic signals so that when the propagation delay though the or each even amplifier stage decreases, the propagation delay through the or each odd amplifier stage increases, to generate frequency divided signal at the output of said last amplifier stage;
wherein said applying steps apply analogue periodic signals to said control electrodes, which analogue periodic signals have an amplitude which cause said transistors to not fully open or frilly close but to act as a variable resistances, and wherein each of the analog periodic signals is referenced to a same voltage supply.

19. A method according to claim 18, wherein each amplifier stage used comprises a differential amplifier.

20. A method according to claim 18, wherein each amplifier stage used comprises an amplifier with hysteresis.

21. A method according to claim 18, wherein applying the first and second periodic signals varies the strength of connection between adjacent amplifier stages.

22. A method according to claim 20, wherein applying the first and second periodic signals varies the hysteresis of each of said amplifier stages.

23. A method according to claim 18, wherein said amplifier stages used comprise an FET type semiconductor integrated circuit.

24. A method according to claim 23, wherein said amplifier stages used comprise a CMOS integrated circuit.

25. A method according to claim 18, wherein the frequency of the input signal to be divided is greater than 100 MHz.

26. A method according to claim 18, wherein said method also uses logic circuits for providing division by ratios other than simple powers of two.

27. A radio receiver comprising:
a first generating means for generating a first periodic signal;
a second generating means for generating a second periodic signal which is in anti-phase with the first periodic signal;
a frequency divider circuit comprising,
(i) first and second input terminals for respectively receiving the first and second periodic signals;
(ii) an even number of amplifier stages connected in series with an output of the last amplifier stage being connected to an input of the first amplifier stage, wherein each amplifier stage has an associated propagation delay and a transistor coupled between a supply terminal and a reference terminal for modulating the propagation delay through the associated amplifier stage;
(iii) means for applying said first periodic signal received at said first input terminal to a control electrode of said transistor of the or each odd amplifier stage and for applying said second periodic signal received at said second input terminal to a control electrode of said transistor of the or each even amplifier stage, to modulate the propagation delays through the associated amplifier stages about half the period of said first and second periodic signals so that when the propagation delay through the or each even amplifier stage decreases, the propagation delay through the or each odd amplifier stage increases; and
(iv) an output terminal connected to the output of said last amplifier stage for outputting a generated frequency divided signal;
wherein said first and second generating means are arranged to generate the respective first and second periodic signals as analogue periodic signals having an amplitude which causes said transistors to be not fully open or fully closed but to act as variable resistances, and
wherein each of the transistors of each odd amplifier stage that is used to modulate the propagation delay through the odd amplifier stage references the first periodic signal to a voltage supply, and each of the transistors of each even amplifier stage that is used to modulate the propagation delay through the even amplifier stage references the second periodic signal to the same voltage supply.

28. A radio receiver according to claim 27, wherein said first and second generating means is formed by a single circuit which is operable to generate said first and second periodic signals.

29. A signal generating circuit comprising:
a first generating circuit operable to generate a first periodic signal;
a second generating circuit operable to generate a second periodic signal which is in anti-phase with the first periodic signal;
a frequency divider circuit comprising:
(i) first and second input terminals for respectively receiving the first and second periodic signals;

(ii) an even number of amplifier stages connected in series with an output of the last amplifier stage being connected to an input of the first amplifier stage, wherein each amplifier stage has an associated propagation delay and a transistor coupled between a supply terminal and a reference terminal for modulating the propagation delay through the associated amplifier stage;

(iii) an applicator operable to apply said first periodic signal received at said first input terminal to a control electrode of said transistor of the or each odd amplifier stage and operable to apply said second periodic signal received at said second input terminal to a control electrode of said transistor of the or each even amplifier stage, to modulate the propagation delays through the associated amplifier stages about half the period of said first and second periodic signals so that when the propagation delay through the or each even amplifier stage decreases, the propagation delay through the or each odd amplifier stage increases; and (iv) an output terminal connected to the output of said last amplifier stage for outputting a generated frequency divided signal;

wherein said first and second generating circuits are arranged to generate the respective first and second periodic signals as analogue periodic signals having an amplitude which causes said transistors to be not fully open or fully closed but to act as variable resistances, and wherein each of the transistors of each odd amplifier stage that is used to modulate the propagation delay through the odd amplifier stage references the first periodic signal to a voltage supply, and each of the transistors of each even amplifier stage that is used to modulate the propagation delay through the even amplifier stage references the second periodic signal to the same voltage supply.

30. A signal generating circuit according to claim 29, wherein said first and second generating circuits are formed by a single circuit which is operable to generate said first and second periodic signals.

* * * * *